(12) United States Patent
Vail et al.

(10) Patent No.: US 8,809,113 B2
(45) Date of Patent: Aug. 19, 2014

(54) SOLUTION-PROCESSED METAL-SELENIDE SEMICONDUCTOR USING SELENIUM NANOPARTICLES

(71) Applicants: Sean Andrew Vail, Vancouver, WA (US); Alexey Koposov, Vancouver, WA (US); Jong-Jan Lee, Camas, WA (US)

(72) Inventors: Sean Andrew Vail, Vancouver, WA (US); Alexey Koposov, Vancouver, WA (US); Jong-Jan Lee, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 13/674,005

(22) Filed: Nov. 10, 2012

(65) Prior Publication Data

US 2014/0134791 A1    May 15, 2014

(51) Int. Cl.
*H01L 31/032*   (2006.01)
*C09D 11/00*    (2014.01)
*B82Y 30/00*    (2011.01)
*B82Y 40/00*    (2011.01)

(52) U.S. Cl.
CPC .......... *H01L 31/0326* (2013.01); *C09D 11/005* (2013.01); *B82Y 30/00* (2013.01); *B82Y 40/00* (2013.01); *C09D 11/54* (2013.01); *C09D 11/00* (2013.01)
USPC ....................................................... 438/102

(58) Field of Classification Search
CPC .... B82Y 30/00; B82Y 40/00; H01L 31/0326; C09D 11/00; C09D 11/005; C09D 11/54
USPC .............. 438/84, 95, 102; 423/508; 136/262; 428/323
See application file for complete search history.

(56) References Cited

U.S. PATENT DOCUMENTS

| | | | |
|---|---|---|---|
| 6,268,014 B1* | 7/2001 | Eberspacher et al. | 427/74 |
| 6,379,585 B1* | 4/2002 | Vecht et al. | 252/301.35 |
| 8,134,150 B2 | 3/2012 | Mitzi et al. | |
| 8,182,721 B2* | 5/2012 | Yu et al. | 252/512 |
| 8,277,894 B2* | 10/2012 | Mosley et al. | 427/256 |
| 2002/0006470 A1* | 1/2002 | Eberspacher et al. | 427/216 |
| 2006/0207644 A1* | 9/2006 | Robinson et al. | 136/243 |
| 2007/0163640 A1* | 7/2007 | Van Duren et al. | 136/262 |
| 2008/0149176 A1* | 6/2008 | Sager et al. | 136/262 |

(Continued)

OTHER PUBLICATIONS

Taurozzi et al., Preparation of Nanoparticle Dispersions From Powdered Material Using Ultrasonic Disruption, 2010, CEINT/NIST, 1-10.*

(Continued)

*Primary Examiner* — Bac Au
*Assistant Examiner* — Sophia Nguyen
(74) *Attorney, Agent, or Firm* — Law Office of Gerald Maliszewski; Gerald Maliszewski

(57) ABSTRACT

A method is provided for forming a solution-processed metal and mixed-metal selenide semiconductor using selenium (Se) nanoparticles (NPs). The method forms a first solution including SeNPs dispersed in a solvent. Added to the first solution is a second solution including a first material set of metal salts, metal complexes, or combinations thereof, which are dissolved in a solvent, forming a third solution. The third solution is deposited on a conductive substrate, forming a first intermediate film comprising metal precursors, from corresponding members of the first material set, and embedded SeNPs. As a result of thermally annealing, the metal precursors are transformed and the first intermediate film is selenized, forming a first metal selenide-containing semiconductor. In one aspect, the first solution further comprises ligands for the stabilization of SeNPs, which are liberated during thermal annealing. In another aspect, the metal selenide-containing semiconductor comprises copper, indium, gallium diselenide (CIGS).

27 Claims, 3 Drawing Sheets

(56) References Cited

U.S. PATENT DOCUMENTS

| | | | |
|---|---|---|---|
| 2009/0145482 A1* | 6/2009 | Mitzi et al. | 136/262 |
| 2011/0094557 A1* | 4/2011 | Mitzi et al. | 136/244 |
| 2011/0097496 A1* | 4/2011 | Mitzi et al. | 427/256 |
| 2011/0206599 A1* | 8/2011 | Keszler et al. | 423/508 |
| 2012/0211074 A1* | 8/2012 | Sager et al. | 136/256 |
| 2012/0235098 A1* | 9/2012 | Ishikawa et al. | 252/519.14 |
| 2012/0288988 A1* | 11/2012 | Inai et al. | 438/95 |
| 2013/0037111 A1* | 2/2013 | Mitzi et al. | 136/264 |
| 2013/0048074 A1* | 2/2013 | Cho et al. | 136/262 |
| 2013/0157407 A1* | 6/2013 | Liu | 438/95 |
| 2013/0168825 A1* | 7/2013 | Bhattacharya | 257/613 |
| 2013/0171768 A1* | 7/2013 | Wu et al. | 438/95 |
| 2013/0233202 A1* | 9/2013 | Cao et al. | 106/31.13 |
| 2013/0256820 A1* | 10/2013 | Fujdala et al. | 257/431 |

OTHER PUBLICATIONS

Chang et al., Effects of heat treatments on the stabilities of polysaccharides substances and barbaloin in gel juice from Aloe vera Miller, Journal of Food Engineering 75 (2006) 245-251.*

Apicella et al. Degradation of the Polysaccharide Component of Gonococcal Lipopolysaccharide by Gonococcal and Meningococcal Sonic Extracts, Infection and Immunity, Apr. 1978, vol. 20, No. 1, p. 228-234.*

Zhang et al., Creation of Higly Stable Selenium Nanoparticles Capped with Hyperbranched Polysaccharide in Water, 2010, Langmuir, 26 (22), 17617-17623.*

Wang et al., 8.01% CIGS solar cells fabricated by air stable low cost ink, Phys. Chem. Chem. Phys., 2012, 14, 11154-11159.*

Kim et al., Role of chelate complexes in densification of CuInSe2 (CIS) thin film prepared from amorphous Cu-In-Se nanoparticle precursors, J. Mater. Chem., 2012, 22, 8444.*

W. Wang, Y-W, Su and C-H. Chang, "Inkjet Printed Chalcopyrite CulnxGa1-x Se2 Thin Film Solar Cells", Solar Energy Materials & Solar Cells 2011, 95, 2616-2620.

W. Wang et al., "8.01% CuInGaSe2 Solar Cells Fabricated by Air-Stable Low-Cost Inks", Physical Chemistry Chemical Physics 2012, 14, 11154-11159.

D. R. Mees et al., "Formation of Selenium Colloids Using Sodium Ascorbate as the Reducing Agent", Journal of Colloid and Interface Science 1995, 170, 254-260.

M. Rajakakshmi and A. K. Arora, "Optical Properties of Selenium Nanoparticles Dispersed in Polymer", Solid State Communications 1999, 110, 75-80.

M. Z. Liu, S. Y. Zhang, Y. H. Shan and M. L. Zhang, "Selenium Nanoparticles Prepared from Reverse Microemulsion Process", Chinese Chemical Letters 2004, 15, 1249-1252.

Z-H, Lin, F-C, Lin and C. R. C. Wang, "Observation in the Growth of Selenium Nanoparticles", Journal of the Chinese Chemical Society 2004, 51, 239-242.

Z-H, Lin and C. R. C. Wang, "Evidence on the Size-Dependent Spectral Evoltion of Selenium Nanoparticles", Materials Chemistry Physics 2005, 92, 591-594.

A. R. Ingole et al., "Green Synthesis of Selenium Nanoparticles Under Ambient Conditions", Chalcogenide Letters 2010, 7, 485-489.

Y. Zhang, J. Wang and L. Zhang, "Creation of Highy Stable Selenium Nanoparticles Capped with Hyperbranched Polysaccharide in Water", Langmuir 2010, 26, 17617-17623.

H. Chen et al., "Selenium Nanowires and Nanotubes Synthesized via a Facile Template-Free Solution Method", Materials Research Bulletin 2010, 45, 699-704.

He et al., "One-Step Instant Synthesis of Protein-Conjugated Quantum Dots at Room Temperature", Science Reports, 3:2825, DOI 10:1038, Oct. 2, 2013.

Romano-Trujillo et al., "Synthesis and characterization of PbSe nanoparticles obtained by a colloidal route using Extran . . . ", Nanotechnology 23, 2012, 185602.

Klayman et al., Reaction of Swelenium with Sodium Boronhydride in Protic Solvents, Journal of American Chemical Society, Jan. 10, 1973, pp. 197-199.

Senthikumar et al., Wurtzite ZnSe quantum dots: synthesis, characterization and PL properties, J Matter Sci: Mater Electrons, pub online Jun. 21, 2012.

* cited by examiner

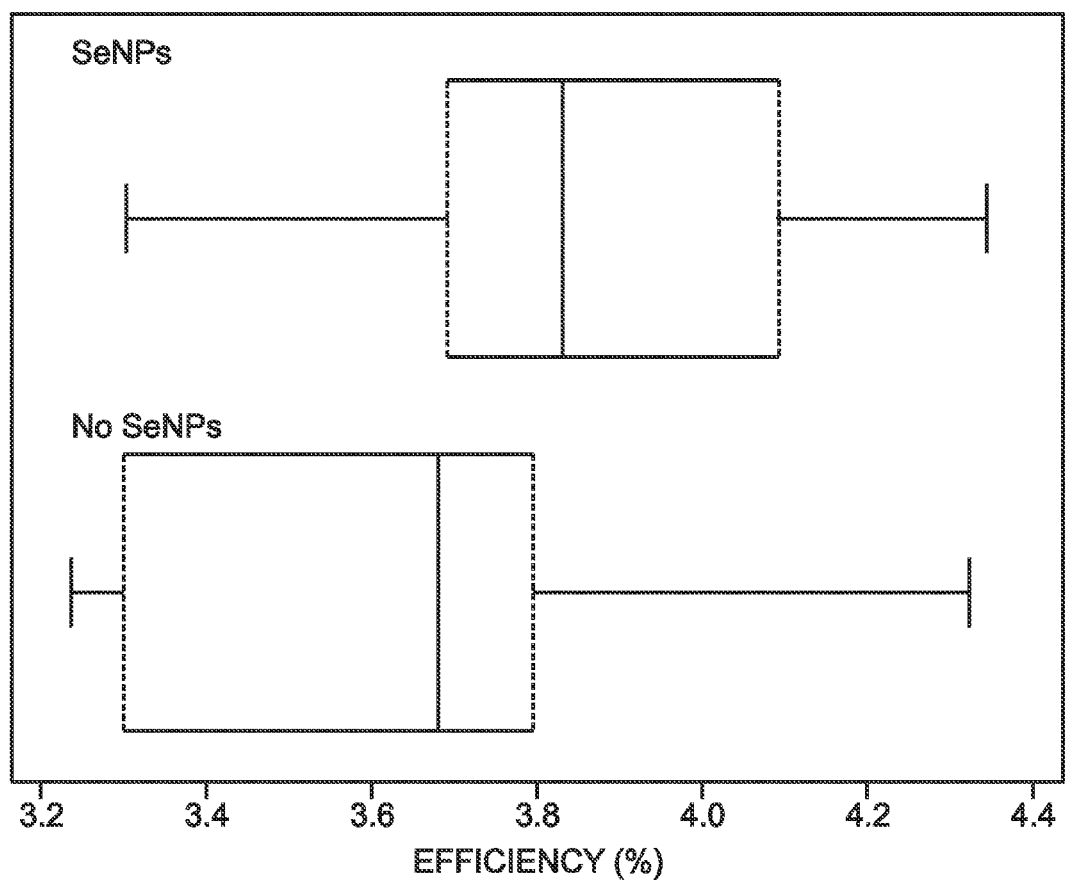

SOLUTION-PROCESSED METAL-SELENIDE SEMICONDUCTOR USING SELENIUM NANOPARTICLES

BACKGROUND OF THE INVENTION

1. Field of the Invention

This invention generally relates to solution based deposition processes and, more particularly, to the formation of metal selenide semiconductor films using selenium nanoparticle solutions.

2. Description of the Related Art

In general, metal and mixed-metal selenides represent important classes of semiconductor materials for electronic and photovoltaic (PV) applications. In particular, copper indium gallium diselenide ($CuIn_{1-x}Ga_xSe_2$ or CIGS) has emerged as a promising alternative to existing thin-film technologies. Overall, CIGS thin films possess a direct and tunable energy band gap, high optical absorption coefficients in the visible to near-infrared (IR) spectrum and have demonstrated power conversion efficiencies (PCEs) approaching 20%. Conventional CIGS fabrication (vacuum) processes typically involve either sequential or co-evaporation (or sputtering) of copper (Cu), indium (In), and gallium (Ga) metal onto a substrate followed by annealing in an atmosphere containing a selenium vapor source to provide the final CIGS absorber layer. Alternatively, evaporation (or sputtering) of copper, indium, gallium and selenium (Se) onto heated substrates may be performed.

In contrast to vacuum approaches, which create an environment to control variables such as the gases introduced and pressure, non-vacuum methods offer significant advantages in terms of both reduced cost and high throughput manufacturing capability via roll-to-roll processing. Electrodeposition or plating of metals (from metal ions in solution) onto conductive substrates represents an alternative CIGS fabrication strategy. Finally, CIGS fabrication via deposition of mixed binary, ternary, and/or quaternary nanoparticles of copper, indium, gallium, and selenium (so called nanoparticle "inks") embodies another non-vacuum approach.

In addition to the approaches described above, a number of alternative approaches and hybrid strategies have been reported with varying degrees of success. Overall, CIGS fabrication via solution-based approaches appears to offer a convenient, low-cost option. According to this method, metal salt (precursors) of copper, indium, and gallium are dissolved in a solvent to form a CIGS ink and subsequently deposited on a substrate to form a film using conventional methods.

Mitzi et al. described a solution-based CIGS deposition strategy using homogenous solutions of Cu, In, Ga and Se (and optionally sulfur) obtained by dissolution in hydrazine.[1] Subsequently, a hydrazine-free approach was reported whereby isolated hydrazinium-based precursors could be deposited to form metal chalcogenide composite films.[2] Unfortunately, the high toxicity and reactivity associated with hydrazine is a major disadvantage for these approaches. Keszler et al. described a solution-based approach for the synthesis of low contamination metal chalcogenides in aqueous media.[3] In general, the formulation consists of aqueous metal chalcogenide precursors as a mixture of metal cation salts, formate anions and a source of chalcogenide (selenium, sulfur) in the form of thermally labile precursors including thiourea, thioformamide, selenourea, selenoformamide, etc. Overall, this method offers both environmentally favorable processing and low CIGS film contamination due to the careful selection of appropriate precursor materials. Finally, Wang et al. reported an inkjet printing method whereby the CIGS absorber layer was deposited by inkjet printing on molybedenum (Mo)-coated substrates from a solution of Cu, In, and Ga salts containing ethylene glycol and ethanolamine.[4] Following selenization and subsequent CIGS device integration, an overall PCE of 5.04% was obtained using this approach. Subsequently, Wang et al. demonstrated CIGS solar cell performance exceeding 8% through careful optimization of Cu, In, and Ga precursor formulations.[5] In general, the latter approaches employ a mixed metal salt precursor strategy which offers the advantages of low-cost and process flexibility.

Unfortunately, most conventional CIGS fabrication strategies require high temperature post-selenization following deposition of the copper, indium, and gallium (CIG) absorber layer. Even in those cases where selenium is integrated into the components before or during the film deposition phase (as in Se containing metal selenide nanoparticles or solution based process with Se precursor), selenium losses during high temperature processing can render the resultant CIGS film as selenium deficient. In addition, an inability for the selenium source vapor to penetrate deep into a deposited CIG film may lead to reduced grain size, poor overall absorber layer growth, and/or morphology as well as poor interfacial contacts.

One of the major disadvantages of high temperature selenization ($H_2Se$ gas or Se fluxes, for example) is the inherent high-toxicity, which can present serious hazards to humans in large-scale production environments. Furthermore, the high-temperature associated with the selenization processes imposes severe limitations on the types of substrates upon which CIGS can be deposited. In light of these facts, it would be advantageous to provide a method through which elemental selenium could be incorporated into the CIGS deposition as part of a solution processing approach. Conceivably, direct selenium incorporation into solution processing could offer several advantages including improved CIGS film quality, reduced thermal budget as well as considerable safety benefits.

Since elemental selenium cannot be practically employed in a solution-based approach as a powder (or other pristine form), soluble selenium precursors in the form of selenium nanoparticles (SeNPs) offer a viable alternative. Despite the novelty of the approach, there exist limited cases in which SeNPs have been suggested as viable options for a solution processed CIGS absorber layer. In some ways, this may be explained by the difficulties associated with synthesizing stable dispersions of SeNPs that can be practically utilized in a precursor solution for CIGS deposition. Since selenium is an important nutritional supplement, a majority of the prior art has focused on bio-compatible SeNPs, whereby the nanoparticles are effectively stabilized by large moieties such as hyperbranched polysaccharides, proteins, and/or high molecular weight polymers, etc. Unfortunately, the use of SeNPs stabilized by exceptionally large species is impractical due to extensive contamination by carbon, oxygen, and nitrogen species upon thermal decomposition, which prevents the realization of high-quality CIGS films. For the most part, various methods for SeNP synthesis reported in the literature represent attempts to form stable, colloidal dispersions by exhaustive measures which do not consider the implications for, and/or consequences of, additional (or practical) processing to afford functional materials.

Regardless of the target application, the fabrication of SeNPs reported in the prior art has been dominated by conventional "chemical" or "thermal" approaches whereby a soluble selenium "precursor" species is transformed to SeNPs upon the action of a chemical reagent under a specified set of conditions and, in almost every case, in the presence of an appropriate stabilizing agent (or ligand), which functions to both control SeNP growth and stabilize the resultant collection of SeNPs in solution. To a significantly lesser extent, the synthesis of SeNPs has been successfully demonstrated via microbiological processes. Below is provided a brief survey of chemical methodologies for SeNP fabrication as described in the prior art.

Mees et al. described the synthesis of selenium colloids in quantitative yield from selenous acid using sodium ascorbate as the reducing agent either in the presence of sodium dodecyl sulfate (SDS) surfactant at room temperature or, alternatively, in the absence of surfactant at elevated temperatures.[6] Rajalakshmi et al. reported the synthesis of SeNPs via precipitation in a viscous polymer solution (polyacrylamide).[7] Liu et al. described the preparation of SeNPs by a reverse microemulsion process using sodium selenosulfate as the selenium source.[8] Lin et al. reported the fabrication of SeNPs through a mild chemical reduction method involving selenous acid, SDS (surfactant, ligand) and sulfur dioxide ($SO_2$, reducing agent).[9] Subsequently, Lin et al. described a facile, size selective method for synthesizing amorphous SeNPs at room temperature with selenous acid, SDS (surfactant, ligand) and sodium thiosulfate as reducing agent.[10] Ingole et al. provided a method for a "green" synthesis of glucose-stabilized SeNPs from sodium selenosulfate at elevated temperatures.[11] Zhang et al. described the fabrication of water-dispersible SeNPs from selenous acid using a hyperbranched polysaccharide (HBP) as stabilizer/capping agent in the presence of ascorbic acid.[12] Chen et al. provided a process for the large scale preparation of trigonal selenium nanowires and nanotubes from sodium selenite and glucose without the need for additional templates or surfactants.[13] Finally, Dwivedi et al. described a simple method for preparing SeNPs (40-100 nm) by reaction of sodium selenosulfate with various organic acids in the presence of polyvinyl alcohol (PVA) as stabilizer in aqueous media.[14]

1. D. B. Mitzi, W. Liu and M. Yuan, "Photovoltaic Device with Solution-Processed Chalcogenide Absorber Layer", US2009/0145482.
2. D. B. Mitzi and M. W. Copel, "Hydrazine-Free Solution Deposition of Chalcogenide Films", U.S. Pat. No. 8,134,150.
3. D. A. Keszler and B. L. Clark, "Metal Chalcogenide Aqueous Precursors and Processes to Form Metal Chalcogenide Films", US2011/0206599.
4. W. Wang, Y-W. Su and C-H, Chang, "Inkjet Printed Chalcopyrite $CuIn_xGa_{1-x}Se_2$ Thin Film Solar Cells", *Solar Energy Materials & Solar Cells* 2011, 95, 2616-2620.
5. W. Wang, S-Y. Han, S-J. Sung, D-H. Kim and C-H. Chang, "8.01% CuInGaSe2 Solar Cells Fabricated by Air-Stable Low-Cost Inks", *Physical Chemistry Chemical Physics* 2012, 14, 11154-11159.
6. D. R. Mees, W. Pysto and P. J. Tarcha, "Formation of Selenium Colloids Using Sodium Ascorbate as the Reducing Agent", *Journal of Colloid and Interface Science* 1995, 170, 254-260.
7. M. Rajalakshmi and A. K. Arora, "Optical Properties of Selenium Nanoparticles Dispersed in Polymer", *Solid State Communications* 1999, 110, 75-80.
8. M. Z. Liu, S. Y. Zhang, Y. H. Shen and M. L. Zhang, "Selenium Nanoparticles Prepared from Reverse Microemulsion Process", *Chinese Chemical Letters* 2004, 15, 1249-1252.
9. Z-H. Lin, F-C. Lin and C. R. C. Wang, "Observation in the Growth of Selenium Nanoparticles", *Journal of the Chinese Chemical Society* 2004, 51, 239-242.
10. Z-H. Lin and C. R. C. Wang, "Evidence on the Size-Dependent Spectral Evolution of Selenium Nanoparticles", *Materials Chemistry and Physics* 2005, 92, 591-594.
11. A. R. Ingole, S. R. Thakare, N. T. Khati, A. V. Wankhade and D. K. Burghate, "Green Synthesis of Selenium Nanoparticles Under Ambient Conditions", *Chalcogenide Letters* 2010, 7, 485-489.
12. Y. Zhang, J. Wang and L. Zhang, "Creation of Highly Stable Selenium Nanoparticles Capped with Hyperbranched Polysaccharide in Water", *Langmuir* 2010, 26, 17617-17623.
13. H. Chen, D-W. Shin, J-G. Nam, K-W. Kwon and J-B. Yoo, "Selenium Nanowires and Nanotubes Synthesized via a Facile Template-Free Solution Method", *Materials Research Bulletin* 2010, 45, 699-704.
14. C. Dwivedi, C. P. Shah, K. Singh, M. Kumar and P. N. Bajaj, "An Organic Acid-Induced Synthesis and Characterization of Selenium Nanoparticles", *Journal of Nanotechnology* 2011, Article ID 651971.

It would be advantageous if a method existed through which selenium, in the form of nanoparticles, could be incorporated into a solution processing approach for the fabrication of metal selenide containing semiconductor materials including CIGS.

SUMMARY OF THE INVENTION

Described herein is a convenient strategy for supplying a source of selenium in the form selenium nanoparticles (SeNPs) for solution-based processing, such as might be useful in the fabrication of a copper indium gallium diselenide ($CuIn_{1-x}Ga_xSe_2$ or CIGS) absorber layer for photovoltaic (PV) applications. Essentially, the SeNPs function as a vehicle for supplying selenium directly into the precursor absorber layer during the deposition process. Within this context, it is important to recognize the restrictions associated with the practical implementation of SeNPs in a solution-based approached. First, the synthesized SeNPs must be sufficiently stabilized in a manner that minimizes CIGS film contamination following thermal processing. In other words, methods utilizing large, macromolecular or polymeric stabilization strategies are necessarily avoided. Furthermore, small (molecular) stabilization and/or pH-assisted methods for SeNP formation are favored due to a need to reduce CIGS film contamination. Second, the as-synthesized SeNPs (in solvent) must be compatible with other components (metal precursors, solvents, additives, etc.) within an established solution-based formulation. Finally, the synthesized SeNPs must be realized at both small dimensions (<200 nm) and high enough concentrations in order to supply sufficient selenium for a beneficial impact on CIGS film formation and quality during thermal processing. The simultaneous realization of high SeNP concentrations and adequate stability are often opposing forces in nanoparticle systems.

Accordingly, a method is provided for forming a solution-processed metal and mixed-metal selenide semiconductor using selenium (Se) nanoparticles (NPs). The method forms a first solution including SeNPs dispersed in a solvent. Added to the first solution is a second solution including a first material set of metal salts, metal complexes, or combinations thereof, which are dissolved in a solvent, forming a third solution. The third solution is deposited on a conductive substrate, forming a first intermediate film comprising metal precursors, made from corresponding members of the first material set, and embedded SeNPs. As a result of thermally annealing, the metal precursors are transformed and the first intermediate film is selenized, forming a first metal selenide-containing semiconductor.

In one aspect, the first solution further comprises ligands for the stabilization of SeNPs. The step of thermally annealing liberates solvents, and at least a majority of the ligands from the first intermediate film. The ligands may be liberated intact, in a partially decomposed, or fully decomposed form.

Additional details of the above-described method, and a method for forming a solution-processed CIGS absorber using SeNPs, are provided below.

BRIEF DESCRIPTION OF THE DRAWINGS

FIG. 3 is a box-and-whisker plot of efficiencies for CIGS solar cells featuring absorber layer deposition via a spin-coated solution of Cu, In, and Ga metal salt precursors—either containing SeNPs (top) or without (control, bottom).

DETAILED DESCRIPTION

Figure 1:
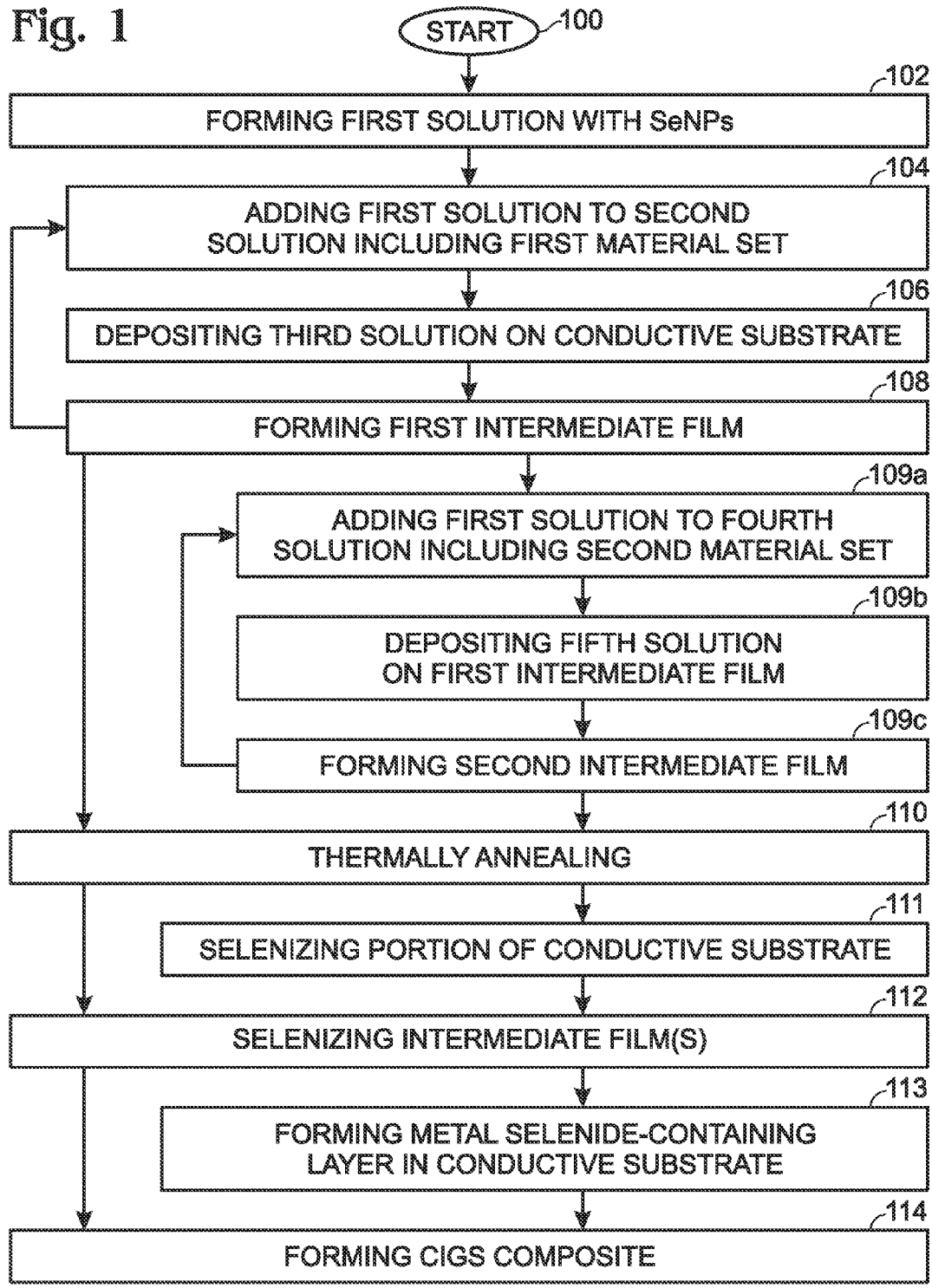
FIG. 1 is a flowchart illustrating steps in a method for forming a solution-processed copper indium gallium diselenide (CIGS) absorber using selenium (Se) nanoparticles (NPs).

FIG. 1 is a flowchart illustrating steps in a method for forming a solution-processed copper indium gallium diselenide (CIGS) absorber using selenium (Se) nanoparticles (NPs). Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method begins at Step 100.

Step 102 forms a first solution including SeNPs dispersed in a solvent. Step 104 adds the first solution to a second solution including a first material set. The first material set may be comprised of metal salts and metal complexes of copper (Cu), indium (In), gallium (Ga), or combinations thereof, dissolved in a solvent. The result is the formation of a third solution. Step 106 deposits the third solution on a conductive substrate. Generally, the conductive substrate is made from a class of materials such as metals, metal alloys, metal oxides, mixed metal oxides, and combinations thereof. For example, the conductive substrate may be aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, and fluorine-doped tin oxide, and combinations thereof.

Step 108 forms a first intermediate film comprising metal precursors, formed from corresponding members of the first material set. The first intermediate film also comprises embedded SeNPs. Typically, the first intermediate includes a proportion of metal oxides or mixed metal oxides. However, in some aspects, the first intermediate film may be a material other than a metal oxide or mixed metal oxide.

Step 110 thermally anneals the first intermediate film. As a result, Step 112 transforms the metal precursors and selenizes the first intermediate film. The term "transform" is used due to the fact that different metal sources yield different intermediate films upon thermal decomposition. If the first intermediate film is a metal oxide, the term "reduce" is more appropriate. However, since the first intermediate film need not be in oxide form, although that is the most likely case, the term transforming (as opposed to reducing) generally covers all cases.

Step 114 forms a CIGS composite. As described in more detail below, the method may build the CIGS composite by stacking layers that include selected CIGS elements. It should also be understood that Steps 104 through 108 may be iteratively repeated to form multiple layers of the same CIGS elements.

In one aspect, as a result of thermally annealing in Step 110, Step 111 transforms and selenizes at least some proportion of metal-containing materials in the conductive substrate. Then, Step 113 forms a metal selenide-containing layer in the conductive substrate underlying the CIGS composite. Alternatively, in some cases metal selenide materials are desired on a pristine metal, metal alloy, or metal oxide substrate. In this case, the selenization process is controlled so that only a small percentage of the conductive substrate is transformed to selenide. At the same time, it is advantageous to maintain a majority of the conductive substrate as intact in order to preserve high conductivity for charge transport. In another case, it may be advantageous to perform complete selenization, which effectively supplies a bilayer structure—a deliberately deposited metal selenide layer on top of a conductive substrate layer that is transformed to metal selenide during selenization.

In another aspect, forming the first solution in Step 102 includes forming the first solution further comprising ligands for the stabilization of SeNPs. Then, thermally annealing in Step 110 includes liberating solvents, and at least a majority of the ligands from the first intermediate film. The ligands may be liberated in an intact, partially decomposed, or fully decomposed form. Some examples of potential ligands include ethylene glycol, glycerol, propylene glycol, polyols, monosaccharides, polysaccharides, and combinations thereof. The first solution solvent of Step 102 may be water, alcohols, polyols, and combinations thereof. However, the use of other, unmentioned, ligands and solvents may also be possible. Likewise, the second solution solvent of Step 104 may be water, alcohols, polyols, and combinations thereof.

More generally, the solvents that make up the majority of the solution (liquid phase) to dissolve the metal salts, often include smaller quantities of "additives". These additives may be required to facilitate dissolution of the metal salts. In order to avoid contamination, the selection of additives may be limited to those that "coordinate to metals only weakly". Furthermore, these additives may be classified as solvents as well. As used herein, a solvent is a mixture of chemicals used to affect dissolution of the metal salts.

In one aspect, thermally annealing in Step 110 includes annealing at a temperature of greater than 300° C. In one variation, Step 110 may further comprise the addition of a selenium vapor source, such as Se, Se+$H_2$, or $H_2$Se.

In another aspect, prior to selenization, Step 109a adds the first solution to a fourth solution including a second material set, dissolved in a solvent, forming a fifth solution. The second material set may be comprised of metal salts and metal complexes of Cu, In, Ga, or combinations thereof. The second material set may be the same or different than the first material set. The solvent of the fifth solution may be of the same type listed above for the second solution. Step 109b deposits the fifth solution on the first intermediate layer. Step 109c forms a second intermediate film comprising metal precursors, formed from corresponding members of the second material set, and embedded SeNPs. Again, it is typical but not necessarily always true that the second intermediate film is a metal oxide or mixed metal oxide. The method then proceeds to Step 110 for thermal annealing. In this aspect, Step 112 transforms the metal precursors and selenizes the first and second (and any other) intermediate films, and Step 114 forms a multi-layer CIGS composite. Steps 109a through 109c may be iteratively repeated to form layers of the same or different CIGS elements.

Figure 2:
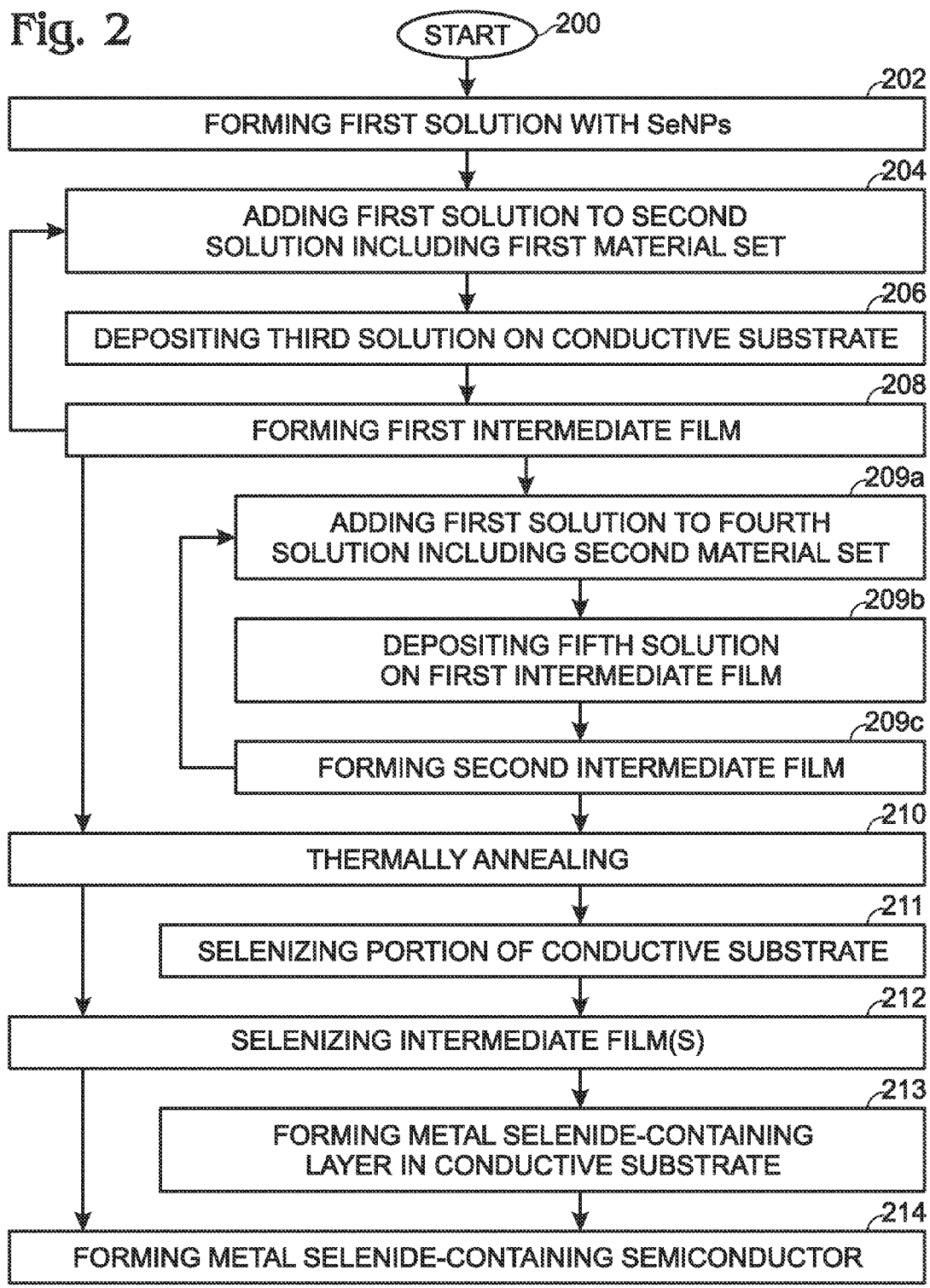
FIG. 2 is a flowchart illustrating a method for forming a solution-processed metal and mixed-metal selenide semiconductor using SeNPs.

FIG. 2 is a flowchart illustrating a method for forming a solution-processed metal and mixed-metal selenide semiconductor using SeNPs. The method begins at Step 200. Step 202 forms a first solution including SeNPs dispersed in a solvent. Some examples of solvents that may be used include water, alcohols, polyols, and combinations thereof. Step 204 adds the first solution to a second solution including a first material set of metal salts, metal complexes, and combinations thereof, dissolved in a solvent, forming a third solution. Likewise, the second solution solvent is typically water, alcohols, polyols, and combinations thereof. Some examples of first material set members include aluminum (Al), antimony (Sb), arsenic (As), bismuth (Bi), cadmium (Cd), cesium (Cs), chromium (Cr), cobalt (Co), copper (Cu), gallium (Ga), germanium (Ge), gold (Au), indium (In), iridium (Ir), iron (Fe), lead (Pb), lithium (Li), manganese (Mn), mercury (Hg), molybdenum (Mo), nickel (Ni), niobium (Nb), osmium (Os), palladium (Pd), platinum (Pt), potassium (K), rhodium (Rh), ruthenium (Ru), silver (Ag), sodium (Na), tantalum (Ta), tin (Sn), titanium (Ti), tungsten (W), vanadium (V), zinc (Zn), zirconium (Zr), and combinations thereof.

Step 206 deposits the third solution on a conductive substrate that is typically made from a class of materials such as metals, metal alloys, metal oxides, mixed metal oxides, combinations thereof. Potential conductive substrate candidate materials include aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, and fluorine-doped tin oxide, and combinations thereof. Step 208 forms a first intermediate film comprising metal precursors, formed from corresponding members of the first material set. The first intermediate film also comprises embedded SeNPs. Typically, but not necessarily in all cases, a proportion of the first intermediate film is comprised of metal oxides and/or mixed metal oxides.

Step 210 thermally anneals. Step 210 may anneal at a temperature of greater than 300° C. Optionally, the annealing is performed in an atmosphere comprising a selenium vapor source, such as Se, Se+$H_2$, or $H_2$Se. As a result, Step 212 transforms the metal precursors and selenizes the first intermediate film, and Step 214 forms a first metal selenide-containing semiconductor.

In one aspect, forming the first solution in Step 202 includes forming the first solution further comprising ligands for the stabilization of SeNPs. Then, thermally annealing in Step 210 includes liberating solvents, and at least a majority of the ligands from the first intermediate film in the form of intact, partially decomposed, or filly decomposed ligands. A non-exhaustive list of ligands includes ethylene glycol, glycerol, propylene glycol, polyols, monosaccharides, polysaccharides, and combinations thereof.

The method may build a multi-layer metal selenide-containing semiconductor by stacking layers. Thus, it should also be understood that Steps 204 through 208 may be iteratively repeated to form multiple layers of the same metal selenide-containing material. Alternatively, as explained below, the metal selenide-containing layers may be made from different materials.

Thus, in one aspect, prior to selenization, Step 209a adds the first solution to a fourth solution including a second material set, dissolved in a solvent, forming a fifth solution. The fifth solution solvent may be the same as those solvents mentioned above. Likewise, the members of the second material set may be selected from the same group of materials available for the first material set, listed above. Step 209b deposits the fifth solution on the first intermediate layer. Step 209c forms a second intermediate film comprising metal precursors, formed from corresponding members of the second material set, and embedded SeNPs. The method then proceeds to Step 210 for thermal annealing. In this aspect, Step 212 transforms the metal precursors and selenizes the first and second (and any other) intermediate films. Step 214 forms a multi-layer metal selenide-containing semiconductor. Steps 209a through 209c may be iteratively repeated to form layers of the same or different metal selenide-containing semiconductor materials.

In another aspect, as a result of thermally annealing in Step 210, Step 211 transforms and selenizes at least some proportion of metal-containing materials in the conductive substrate. Then, Step 213 forms a metal selenide-containing layer in the conductive substrate underlying the first metal selenide-containing semiconductor layer.

In one aspect, as a result of thermally annealing in Step 210, Step 211 transforms and selenizes at least some proportion of metal-containing materials in the conductive substrate. Then, Step 213 forms a metal selenide-containing layer in the conductive substrate underlying the metal selenide-containing semiconductor. Alternatively, in some cases metal selenide materials are desired on a pristine metal, metal alloy, or metal oxide substrate. In this case, the selenization process is controlled so that only a small percentage of the conductive substrate is transformed to selenide. At the same time, it is advantageous to maintain a majority of the conductive substrate as intact in order to preserve high conductivity for charge transport. In another case, it may be advantageous to perform complete selenization, which effectively supplies a bilayer structure—a deliberately deposited metal selenide layer on top of a conductive substrate layer that is transformed to selenide during selenization.

Described herein are methods for providing and integrating SeNPs into a mixture of dissolved metal precursors for solution-processed CIGS fabrication. All other technologies for CIGS device integration can be transitioned from existing (conventional) approaches. Conveniently, the SeNPs are readily synthesized in situ from a water soluble Se precursor (selenous acid, $H_2SeO_3$) through dissolution of selenium dioxide in water. The SeNP formation, growth, and stabilization are affected by the presence of a small organic ligand (dextrose) during heating. Following reaction, the SeNPs can be isolated from the medium and excess ligand by centrifugation, and then re-suspended in solvent to form a stable suspension and sequentially passed through a syringe filter (1 μm, 450 nm and 200 nm, respectively). Subsequent dilution of the SeNPs in EG with copious amounts of ethanol fails to precipitate (destabilize) the SeNP solution, which remains stable for several days until the onset of significant aggregation.

For the purposes of optimizing the method for synthesizing SeNPs, a series of pH studies was conducted. Parallel experiments were performed using aqueous solutions of selenous acid ($H_2SeO_3$) for which the solution pH was adjusted to either pH=5 (acidic), pH=7 (neutral), or pH=9 (basic) via precise addition of ammonium hydroxide. As was the case with an as-prepared selenous acid solution (pH~1-2), the reactivity was sluggish for the precursor solution adjusted to pH=5 following addition of glucose with subsequent heating. In contrast, the selenous acid precursor solutions that had been adjusted to either pH=7 or pH=9 exhibited accelerated SeNP formation, as confirmed by a rapid transition of solution color from colorless to red upon addition of glucose with moderate heating. This SeNP synthesis was accomplished within a set of highly restrictive parameters in order to provide compatibility with solution-based process formulations for CIGS deposition.

EXPERIMENTAL DETAILS

Method A: SeNPs

Selenium dioxide ($SeO_2$, 100 mg) was dissolved in water (2 mL) with stirring at room temperature. The pH of the resulting $H_2SeO_3$ solution was adjusted to pH=9 by addition of $NH_4OH$. Next, glucose (812 mg) was added and the solution was heated (80-90° C.) for 30 minutes. After cooling, the SeNPs were separated by centrifugation followed by removal of water. Finally, the SeNPs were suspended in ethylene glycol (5 mL) via sonication and filtered through a 200 nm syringe.

Method B: SeNPs

2× Concentration of Se Precursor

Selenium dioxide ($SeO_2$, 200 mg) was dissolved in water (2 mL) with stirring at room temperature. The pH of the resulting $H_2SeO_3$ solution was adjusted to pH=9 by addition of $NH_4OH$. Next, glucose (1.22 g) was added and the solution was heated on a hot plate (80-90° C.) for 30 minutes. After cooling, the SeNPs were separated by centrifugation followed by removal of water. Finally, the SeNPs were suspended in ethylene glycol (5 mL) via sonication and filtered through a 200 nm syringe.

For a typical solution-processed CIGS formulation, metal salts of Cu, In, and Ga are dissolved in a solvent such as water and/or low molecular weight alcohols. In order to provide a more viscous (thicker) solution of precursors to enable dense film deposition (inkjet printing, doctor blade, etc.), a viscosity "modifier" is commonly added. Although the nature of this material can vary from small molecules to polymers, it is advantageous to minimize the contamination footprint of this agent following subsequent thermal treatment. In light of this, small, viscous polyols such as ethylene glycol are potential candidates. With this in mind, a technology is presented herein whereby the SeNPs are provided as a composite material (supplied as a stable SeNP dispersion in ethylene glycol).

Preliminary CIGS Solar Cell Prototypes with Integrated SeNPs

CIGS Device Fabrication:

Solutions of copper (Cu), indium (In) and gallium (Ga) precursor salts, either with SeNPs or without (control), were deposited on molybdenum (Mo)-coated glass substrates via a sequential spin-coating method to achieve a desired film thickness. In this case, the metal salt composition comprised Cu, In, and Ga in a 1:0.7:0.3 molar ratio. An aliquot of SeNPs (in EG) was added to the metal salt solution prior to spin-coating. The substrates were thermally annealed following each spin-coating cycle to remove solvent(s) and afford a dense Cu—In—Ga film with embedded SeNPs. Overall, separate substrates were prepared in the manner described above containing (1) No SeNPs (control) and (2) with SeNPs. Although spin-coating is not the only method available for film deposition, it proved sufficient for evaluating the SeNP strategy.

All complementary integration processes/technologies for final CIGS device were conventional. The Cu—In—Ga/Mo/glass substrates (SeNP and control) were subjected to selenization (exposed to $H_2$ gas and selenium powder at elevated temperature) to convert the Cu—In—Ga film to CIGS. Subsequently, a thin (n-type) buffer layer of cadmium sulfide (CdS) was deposited by chemical bath deposition (CBD) on top of the CIGS layer. Next, sequential deposition of intrinsic zinc oxide (iZnO) then aluminum-doped ZnO (AZO) was performed by vacuum sputtering. Finally, aluminum contacts were deposited by evaporation. Substrates were mechanically scribed to isolate individual devices for performance measurements.

FIG. 3 is a box-and-whisker plot of efficiencies for CIGS solar cells featuring absorber layer deposition via a spin-coated solution of Cu, In, and Ga metal salt precursors—either containing SeNPs (top) or without (control, bottom). The plot represents a total of 15 and 10 independent measurements (representing 15 and 10 individual devices) for the SeNP and control devices, respectively. In the plot, median values for the low (dotted line), middle (bold line) and high (dashed lines) ranges are indicated on the boxes while the horizontal lines (whiskers) reflect the full range of measured efficiencies.

As can be seen from the figure, the measured efficiencies for both SeNP and control devices extend across the range from ~3.25-3.85%. However, the maximum efficiency was reported for SeNP devices (4.34%), while the lowest was observed for the controls (3.25%). More importantly, the distribution of measured efficiencies warrants consideration. For the SeNP device, 75% of the efficiency data are located above 3.7% (3.7%-4.3%). At the same time, 75% of the data for the control device exists below 3.8%.

The efficiency data for the CIGS solar cells presented in FIG. 3 supports the beneficial impact of SeNPs for a solution-processed CIGS absorber layer. Currently, the performance enhancement due to SeNPs is only limited by a modest effective concentration of SeNPs in the CIGS precursor solution. With respect to SeNP concentration limitations, the preparation and subsequent stabilization must be performed within highly restrictive parameters such as specific (compatible) solvent systems and the need to minimize impurities (both in terms of Se precursor and stabilizing ligand). Furthermore, it was confirmed that contamination by SeNP materials during thermal processing was effectively minimized, which is consistent with SeNP synthesis strategy provided herein. Currently, the benefit from SeNPs is limited only by the concentration of SeNPs, rather than strategic scope.

The processes presented herein provide for the preparation of a stable solution of SeNPs for subsequent incorporation into metal containing, solution-based formulations for fabricating a CIGS absorber layer.

Although the CIGS films fabricated with SeNPs may be selenium deficient and require post selenization, the presence of Se in the deposited layer is expected to improve CIGS film growth and interfacial properties (such as CIGS/Mo).

Processes have been provided for forming solution-processed metal and mixed-metal selenide semiconductors, and CIGS using SeNPs. Examples of materials, solvents, and process variables have been presented to illustrate the invention. However, the invention is not limited to merely these examples. Other variations and embodiments of the invention will occur to those skilled in the art.

We claim:

1. A method for forming a solution-processed metal and mixed-metal selenide semiconductor using selenium (Se) nanoparticles (NPs), the method comprising:
   forming a first solution including discrete elemental SeNPs dispersed in a solvent;
   adding the first solution to a second solution including a first material set selected from a first group consisting of metal salts, metal complexes, and combinations thereof, dissolved in a solvent, forming a third solution, wherein the discrete elemental SeNPs in the third solution remain unreacted with the first material set and solvent, and wherein the third solution excludes any metal selenide, which is defined as selenium reacted with a metal;
   depositing only the third solution on a conductive substrate to form a first intermediate film, wherein the discrete elemental SeNPs in the first intermediate film remain unreacted with the first material set and solvent, and wherein the first intermediate film excludes any metal selenide;
   thermally annealing the first intermediate film in an atmosphere comprising a selenium vapor source;
   as a result of the discrete elemental SeNPs in the first intermediate film and the selenium vapor, selenizing the first intermediate film; and,
   forming a metal selenide-containing semiconductor.

2. The method of claim 1 wherein forming the first solution includes forming the first solution further comprising ligands for the stabilization of the discrete elemental SeNPs; and,
   wherein thermally annealing includes liberating solvents, and at least a majority of the ligands from the first intermediate film.

3. The method of claim 2 wherein liberating at least the majority of ligands includes liberating the ligands in a form selected from a group consisting of intact, partially decomposed, and fully decomposed ligands.

4. The method of claim 2 wherein the ligands in the first solution are selected from a group consisting of ethylene glycol, glycerol, propylene glycol, polyols, monosaccharides, polysaccharides, and combinations thereof.

5. The method of claim 1 wherein the first material set is selected from a group consisting of aluminum (Al), antimony (Sb), arsenic (As), bismuth (Bi), cadmium (Cd), cesium (Cs), chromium (Cr), cobalt (Co), copper (Cu), gallium (Ga), germanium (Ge), gold (Au), indium (In), iridium (Ir), iron (Fe), lead (Pb), lithium (Li), manganese (Mn), mercury (Hg), molybdenum (Mo), nickel (Ni), niobium (Nb), osmium (Os), palladium (Pd), platinum (Pt), potassium (K), rhodium (Rh), ruthenium (Ru), silver (Ag), sodium (Na), tantalum (Ta), tin (Sn), titanium (Ti), tungsten (W), vanadium (V), zinc (Zn), zirconium (Zr), and combinations thereof.

6. The method of claim 1 wherein the first and second solution solvents are selected from a group consisting of water, alcohols, polyols, and combinations thereof.

7. The method of claim 1 wherein thermally annealing includes annealing at a temperature of greater than 300° C.

8. The method of claim 7 where the selenium vapor source is selected from a group consisting of Se, Se+$H_2$, and $H_2$Se.

9. The method of claim 1 wherein the conductive substrate is selected from a class of materials selected from a group consisting of metals, metal alloys, metal oxides, mixed metal oxides, and combinations thereof.

10. The method of claim 9 wherein the conductive substrate is selected from a group of materials consisting of aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, and fluorine-doped tin oxide, and combinations thereof.

11. The method of claim 1 further comprising:
    prior to selenizing the first intermediate film, adding the first solution to a fourth solution including a second material set selected from the first group, dissolved in a solvent, forming a fifth solution, wherein the discrete elemental SeNPs in the fifth solution remain unreacted with the second material set and solvent, and wherein the fifth solution excludes any metal selenide;
    depositing only the fifth solution to form a second intermediate film on the first intermediate film, wherein the discrete elemental SeNPs in the second intermediate film remain unreacted with the second material set and solvent, and wherein the second intermediate film excludes any metal selenide;
    wherein selenizing the first intermediate film includes additionally selenizing the second intermediate film as a result of the discrete elemental SeNPs in the second intermediate film and the selenium vapor; and,
    wherein forming the metal selenide-containing semiconductor includes forming a multi-layered metal selenide-containing semiconductor.

12. The method of claim 1 further comprising:
    as a result of thermally annealing, transforming and selenizing at least some proportion of metal-containing materials in the conductive substrate; and,
    forming a metal selenide-containing layer in the conductive substrate underlying the first metal selenide-containing semiconductor.

13. A method for forming a solution-processed copper indium gallium diselenide (CIGS) material using selenium (Se) nanoparticles (NPs), the method comprising;
    forming a first solution including discrete elemental SeNPs dispersed in a solvent;
    adding the first solution to a second solution including a first material set selected from a first group consisting of metal salts and metal complexes of copper (Cu), indium (In), gallium (Ga), and combinations thereof, dissolved in a solvent, forming a third solution, wherein the discrete elemental SeNPs in the third solution remain unreacted with the first material set and solvent, and wherein the third solution excludes any metal selenide, where a metal selenide is defined herein as selenium reacted with a metal;
    depositing only the third solution to form a first intermediate film on a conductive substrate, wherein the discrete elemental SeNPs in the first intermediate film remain unreacted with the first material set and solvent, and wherein the first intermediate film excludes any metal selenide;
    thermally annealing the first intermediate film in an atmosphere comprising selenium vapor;
    as a result of the discrete SeNPs in the first intermediate film and the selenium vapor, selenizing the first intermediate film; and,
    forming a CIGS composite.

14. The method of claim 13 wherein forming the first solution includes forming the first solution further comprising ligands for the stabilization of the discrete elemental SeNPs; and,
    wherein thermally annealing includes liberating solvents, and at least a majority of the ligands from the first intermediate film.

15. The method of claim 14 wherein liberating at least the majority of ligands includes liberating the ligands in a form selected from a group consisting of intact, partially decomposed, and fully decomposed ligands.

16. The method of claim 14 wherein the ligands in the first solution are selected from a group consisting of ethylene glycol, glycerol, propylene glycol, polyols, monosaccharides, polysaccharides, and combinations thereof.

17. The method of claim 13 wherein the first and second solution solvents are selected from a group consisting of water, alcohols, polyols, and combinations thereof.

18. The method of claim 13 wherein thermally annealing includes annealing at a temperature of greater than 300° C.

19. The method of claim 18 where the selenium vapor source is selected from a group consisting of Se, Se+$H_2$, and $H_2$Se.

20. The method of claim 13 wherein the conductive substrate is selected from a class of materials selected from a group consisting of metals, metal alloys, metal oxides, mixed metal oxides, and combinations thereof.

21. The method of claim 20 wherein the conductive substrate is selected from a group of materials consisting of aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, and fluorine-doped tin oxide, and combinations thereof.

22. The method of claim 13 further comprising:
prior to selenizing the first intermediate film, adding the first solution to a fourth solution including a second material set selected from the first group, dissolved in a solvent, forming a fifth solution, wherein the discrete elemental SeNPs in the fifth solution remain unreacted with the second material set and solvent, and wherein the fifth solution excludes any metal selenide;
depositing only the fifth solution to form a second intermediate film on the first intermediate film, wherein the discrete elemental SeNPs in the second intermediate film remain unreacted with the second material set and solvent, and wherein the second intermediate film excludes any metal selenide;
wherein selenizing the first intermediate film includes additionally selenizing the second intermediate film as a result of the discrete elemental SeNPs in the second intermediate film and the selenium vapor; and,
wherein forming the CIGS composite includes forming a multi-layered CIGS composite.

23. The method of claim 13 further comprising:
as a result of thermally annealing, transforming and selenizing at least some proportion of metal-containing materials in the conductive substrate; and,
forming a metal selenide-containing layer in the conductive substrate underlying the CIGS composite.

24. A method for forming a solution-processed metal and mixed-metal selenide semiconductor using selenium (Se) nanoparticles (NPs), the method comprising:
forming a first solution including SeNPs dispersed in a solvent;
adding the first solution to a second solution including a first material set selected from a first group consisting of metal salts, metal complexes, and combinations thereof, dissolved in a solvent, forming a third solution;
depositing the third solution on a conductive substrate;
forming a first intermediate film comprising metal precursors, formed from corresponding members of the first material set and SeNPs that remain unreacted with the metal precursors, where the first intermediate film excludes a metal selenide, and where a metal selenide is defined herein as selenium reacted with a metal;
thermally annealing;
as a result, transforming the metal precursors and selenizing the first intermediate film, and transforming and selenizing at least some proportion of metal-containing materials in the conductive substrate; and,
forming a metal selenide-containing semiconductor, and forming a metal selenide-containing layer in the conductive substrate underlying the first metal selenide-containing semiconductor.

25. A method for forming a solution-processed copper indium gallium diselenide (CIGS) material using selenium (Se) nanoparticles (NPs), the method comprising:
forming a first solution including SeNPs dispersed in a solvent;
adding the first solution to a second solution including a first material set selected from a first group consisting of metal salts and metal complexes of copper (Cu), indium (In), gallium (Ga), and combinations thereof, dissolved in a solvent, forming a third solution;
depositing the third solution on a conductive substrate;
forming a first intermediate film comprising metal precursors, formed from corresponding members of the first material set and SeNPs that remain unreacted with the metal precursors, where the first intermediate film excludes a metal selenide, and where a metal selenide is defined herein as selenium reacted with a metal;
thermally annealing the first intermediate film;
as a result, transforming the metal precursors and selenizing the first intermediate film, and transforming and selenizing at least some proportion of metal-containing materials in the conductive substrate; and,
forming a CIGS composite, and forming a metal selenide-containing layer in the conductive substrate underlying the CIGS composite.

26. The method of claim 1 further comprising:
prior to thermally annealing the first intermediate film in an atmosphere comprising a selenium vapor source, thermal annealing the first intermediate film in an ambient atmosphere; and,
oxidizing the first intermediate film in response to the ambient atmosphere.

27. The method of claim 13 further comprising:
prior to thermally annealing the first intermediate film in an atmosphere comprising a selenium vapor source, thermal annealing the first intermediate film in an ambient atmosphere; and,
oxidizing the first intermediate film in response to the ambient atmosphere.

* * * * *